United States Patent
Karamatsu et al.

[11] Patent Number: 6,151,796
[45] Date of Patent: Nov. 28, 2000

[54] SUBSTRATE DRYING DEVICE, DRYING METHOD AND SUBSTRATE DRIED BY THE SAME

[75] Inventors: Hamataro Karamatsu, Nara-gun; Masanao Hori, Tokyo; Seiji Katayama, Moriyama, all of Japan

[73] Assignee: KEM-TEC Japan Co., Ltd., Japan

[21] Appl. No.: 09/217,778

[22] Filed: Dec. 21, 1998

[30] Foreign Application Priority Data

Jun. 4, 1998 [JP] Japan ..................... 10-155975

[51] Int. Cl.[7] ................................. F26B 13/30
[52] U.S. Cl. ................... 34/92; 34/403; 34/406
[58] Field of Search .................. 34/78, 92, 403, 34/402, 408, 409, 410, 412, 404

[56] References Cited

U.S. PATENT DOCUMENTS

| | | | |
|---|---|---|---|
| 5,133,136 | 7/1992 | Sykora | 34/92 |
| 5,349,762 | 9/1994 | Kato et al. | 34/92 |
| 5,377,425 | 1/1995 | Kawakami et al. | 34/408 |
| 5,426,865 | 6/1995 | Ikeda et al. | 34/408 |
| 5,515,618 | 5/1996 | Matsumura et al. | 34/92 |

*Primary Examiner*—James C. Yeung
*Attorney, Agent, or Firm*—Ostrolenk, Faber, Gerb & Soffen, LLP

[57] ABSTRACT

A substrate drying device includes a reduced pressure enclosure including an airproof door, and an exhaustion device. Inside of the enclosure is caused to be a sealed state when the airproof door is closed. After a substrate to which an application material is applied is received into the reduced pressure enclosure, the airproof door is closed to make inside of the reduced pressure enclosure be an airproof state. Subsequently, inside of the reduced pressure enclosure is exhausted by the exhaustion device to perform for eliminating air bubbles in the application material and drying the application material on the substrates. The exhaustion device may include a reserve tank that has a volume capable of rapidly reducing a pressure of the internal volume of the reduced pressure enclosure to maintain a predetermined negative pressure. A rapid exhaustion of the inside of the reduced pressure enclosure is performed by connecting the reserve tank to the reduced pressure enclosure.

5 Claims, 2 Drawing Sheets

SUBSTRATE DRYING DEVICE, DRYING METHOD AND SUBSTRATE DRIED BY THE SAME

BACKGROUND OF THE INVENTION

1. Field of the Invention

The present invention relates to a substrate drying device, drying method and substrate dried by the method, and more particularly, to a substrate drying device for drying various kinds of application materials, such as a solder resist material, applied to a surface of the substrate before a subsequent step when printed circuit boards are fabricated, and drying method and substrate dried by the method.

2. Background Art

FIG. 4 shows an example of a conventional substrate drying device of this kind in the prior art. Substrates 10 on which an application material 11 such as a solder resist material is applied in filmy state are placed on an appropriate transport means, such as a belt conveyor 91, at regular interval. The belt conveyor 91 is provided with a cover 92 which covers the belt conveyor 91 like a tunnel, and plural heating means 93, such as a heater, are provided within the cover 92. Drying is achieved by heating the substrates 10 passing through inside of the cover 92 using these heating means to accelerate vaporization of a solvent in the application material 11.

Drying of the application material 11 is performed by evaporating the solvent in the application material 11 in order to prevent generation of some trouble in subsequent steps, such as an exposure step. In addition, generation of a defect in a development step or the like should be prevented by eliminating air bubbles which are involved into the application material 11 during applying operation.

However, in the substrate drying device 90 having a configuration of the prior art, compatibility between reducing the drying time and eliminating air bubbles in the application material 11 was difficult. In other words, if the heaters 93 increase a heating temperature to accelerate vaporization of a solvent, the application material 11 will be dried rapidly to increase its viscosity, resulting in difficulty in eliminating air bubbles.

In such a case, generation of defective in the following steps is often originated from the air bubbles in the application material 11. Therefore, an effect resulted from only reducing the drying time in order to decrease a proportion defective can not be expected, so that the time required to dry the substrates 10 in the substrate drying device 90 will need a long period of time, such as 10 to 20 minutes.

This causes a detention time in a step to increase, resulting in problems of detracting a productivity and the like, and also this needs a long period of detention time as described above in a consecutive production steps of the substrates 10, resulting in an increase in the size of the substrate drying device 90 itself. Thus, such a problem that an arrangement of the substrate drying device 90 becomes difficult may occur, accordingly, a need arises for solving these problems.

Additionally, even if extended periods are used for the method described above, eliminating air bubbles can not be improved. That is, the substrates 10 are sometimes dried with air bubbles more than 30 micrometers involved, so that defective substrates may be finally produced.

SUMMARY OF THE INVENTION

It is an object of the present invention to provide a substrate drying device which can rapidly make it possible to eliminate air bubbles and dry substrates in order to solve the above described problems of the prior art.

It is another object of the present invention to provide a substrate drying device that can rapidly eliminate air bubbles and dry substrates without increasing the size of the substrate drying device.

Accordingly, the object of the present invention is to provide a substrate drying device for eliminating air bubbles in a liquid application material applied to a surface of a substrate and drying the material, in which the substrate drying device comprises a reduced pressure enclosure comprising an airproof door at least at one position and an exhaustion device for exhausting air inside of the reduced pressure enclosure. The inside of the enclosure is made a sealed state when the airproof door is closed. The substrate is caused to be under a reduced pressure state to eliminate air bubbles in the application material and dry the material by receiving the substrate into the reduced pressure enclosure and by performing exhaustion by the exhaustion device after the airproof door is closed to make inside of the reduced pressure enclosure.

Further, another object of the present invention is to provide a substrate drying device in which the exhaustion device of the substrate drying device further comprises a reserve tank which has a volume capable of rapidly reducing a pressure of an internal volume of the reduced pressure enclosure to maintain a predetermined negative pressure and a rapid exhaustion of inside of the reduced pressure enclosure is performed by connecting the reserve tank to the reduced pressure enclosure caused to be an airproof state.

It is a further object of the present invention to provide a method for eliminating air bubbles in an application material and drying the application material which can effectively eliminate air bubbles involved in the application material and dry the material.

That is, the object of the present invention is to provide a method for eliminating air bubbles in a liquid application material applied to a surface of substrates and for drying the material, in which the method comprises the steps of receiving the substrates to which the application material has been applied into inside of a reduced pressure enclosure, causing inside of the reduced pressure enclosure to be an airproof state, and exhausting rapidly by an exhaustion device which is communicated with the reduced pressure enclosure and exhausts inside of the reduced pressure enclosure, in order to eliminate the air bubbles in the application material and to dry the material.

It is a further object of the present invention to provide substrates without any defect as the final production substrates in which eliminating air bubbles and drying an application material have been performed.

That is, the object of the present invention is to provide a substrate prepared by applying a liquid application material to a surface of the substrate, eliminating air bubbles in the application material, drying the material, and performing an additional treatment, wherein the eliminating air bubbles in the application material and drying the material are performed by receiving the substrate to which the application material has been applied into a sealed container and by reducing a pressure inside of the sealed container.

DETAILED DESCRIPTION OF THE PREFERRED EMBODIMENTS

Figure 1:
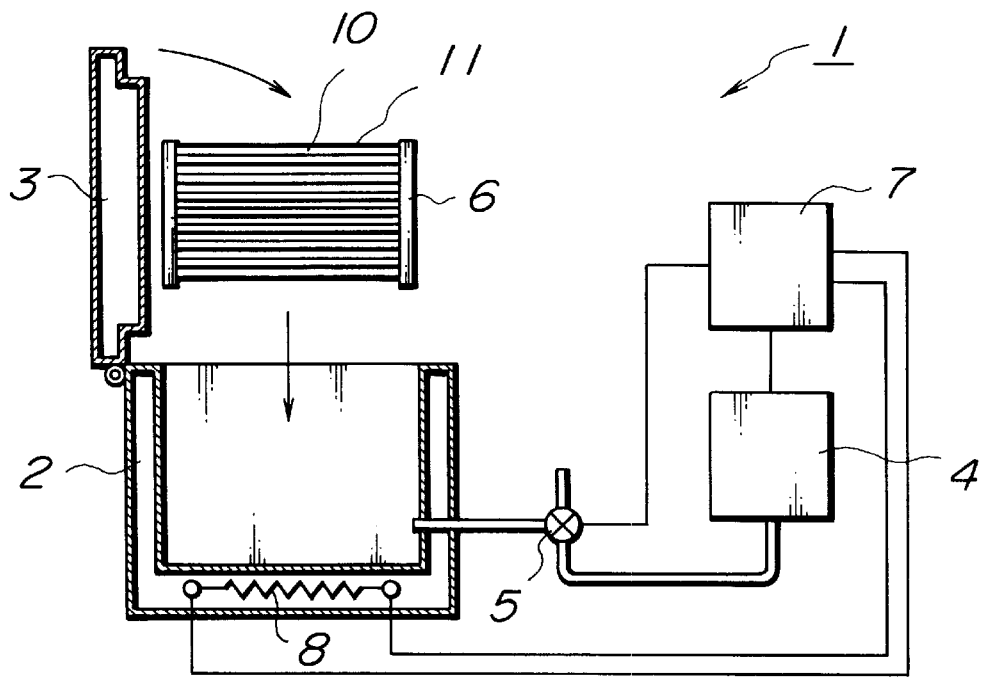
FIG. 1 is a schematic diagram showing a first embodiment of a substrate drying device according to the present invention.

Next, the present invention will be explained in detail by way of embodiments in the figures of the accompanying drawings. Reference numeral 1 in FIG. 1 is a substrate drying device of a first embodiment according to the present invention. To facilitate understanding, the substrate drying device 1 will be explained as a batch processing in this first embodiment.

A reduced pressure enclosure 2 formed, for example, as a boxy shape is provided in the substrate drying device 1. The reduced pressure enclosure 2 is provided with an airproof door 3 at an appropriate position, such as on the upper surface thereof, and when the airproof door 3 is closed, inside of the reduced pressure enclosure 2 becomes a sealed state. Incidentally, the reduced pressure enclosure 2 may be provided with an electric heater 8. Also, the reduced pressure enclosure 2 may be provided with an ultrasonic vibration element.

In addition, an exhaustion device 4, such as a vacuum pump or blower, is connected to the reduced pressure enclosure 2 through an electromagnetic valve 5. When the reduced pressure enclosure 2 is in the airproof state by closing the airproof door 3, exhaustion within the reduced pressure enclosure 2, i.e., reduction of pressure, can be performed, and by operating the electromagnetic valve 5, inside of the reduced pressure enclosure 2, now in the reduced pressure state, can be changed to an atmospheric pressure.

Furthermore, the reduced pressure enclosure 2 can receive a plurality of substrates 10 retained by a retention jig 6 with rack shape configuration. A controller 7 is connected to the exhaustion device 4. The controller 7 controls the driving of the exhaustion device 4. Additionally, the controller 7 may control only the operation of the electromagnetic valve 5, or the exhaustion device 4 and the electromagnetic valve 5 associated with the airproof door 3, further the controller 7 can also control the electric heater 8 and also the ultrasonic vibration element.

Then, the function and effect of the substrate drying device 1 with the above-described configuration according to the present invention will be explained based on an operation procedure. Firstly, the substrates 10, to which the application material 11 is applied in an immediately preceding step and which are retained by the retention jig 6 in an undried state, are received into inside of the reduced pressure enclosure 2 and the airproof door 3 is closed. In a subsequent step, the controller 7 switches the electromagnetic valve 5 to a side of the exhaustion device 4, and a decompression of the reduced pressure enclosure 2 is performed by driving the exhaustion device 4.

Air bubbles involved into the application material 11 in an applying step are eliminated by this decompression as a first function. At the same time, as a second function, since the pressure inside of the reduced pressure enclosure 2 is reduced, a boiling point of a solvent in the application material 11 is lowered to accelerate the evaporation, i.e., the drying is advanced.

Incidentally, if the degree of decompression in the reduced pressure enclosure 2 is set at extremely high, boiling points of some solvents included in the application material 11 are reached even at room temperature to boil and generate air bubbles due to the boil in the application material 11, so that an appropriate degree of vacuum should be set depending on the composition and method of application of the application material 11. Preferably, a degree of vacuum suitable for use herein is from 260 to 360 mmHg (34663 to 47996 Pa), and more preferably from 290 to 310 mmHg (38663 to 41329 Pa). The time to reach the degree of vacuum is desirable to be short to some extent. A preferable time to reach degree of vacuum suitable for use herein is below 10 seconds and above 5 seconds. A rapid decompression below 5 seconds causes the solvent to suddenly boil, so is not desirable. On the other hand, if the time is above 10 seconds, the effect of eliminating air bubbles according to the present invention can not be expected.

In addition, the similar attention should also be needed when the electric heater 8 is incorporated in the reduced pressure enclosure 2. That is, the heating temperature by the electric heater 8 should be controlled in a range in which the solvent under reduced pressure is not caused to suddenly boil. Further, it is desirable to attract such an attention, as appropriate, that the electric heater 8 is not turned ON for a while after the decompression is started to prevent the generation of any problem in eliminating air bubbles resulted from a rapid evaporation of the solvent due to heating.

It is necessary that the time required for elliminating air bubbles and drying by the decompression should be set to an appropriate degree of vacuum holding time depending on a type of application material and method for application. A desirable degree of vacuum holding time is 10 seconds or more to less than 180 seconds. If the time is less than 10 seconds, an acceptable eliminating air bubbles and drying can not be performed, and if it is 180 seconds or more, the processing time will take a long period of time, resulting in a loss of the effect of the present invention.

As described above, after the treatments of eliminating air bubbles and drying for the substrates 10 have been completed, inside of the reduced pressure enclosure 2 is switched to the atmospheric pressure by the electromagnetic valve 5. Then, the airproof door 3 is opened and the substrates 10 are taken out to be supplied to a subsequent step, such as an exposure step, for example. Therefore, according to the substrate drying device 1 of the present invention, both of the eliminating air bubbles and drying operations are accelerated, resulting in a shortened treatment time in the substrate drying device 1.

Figure 2:
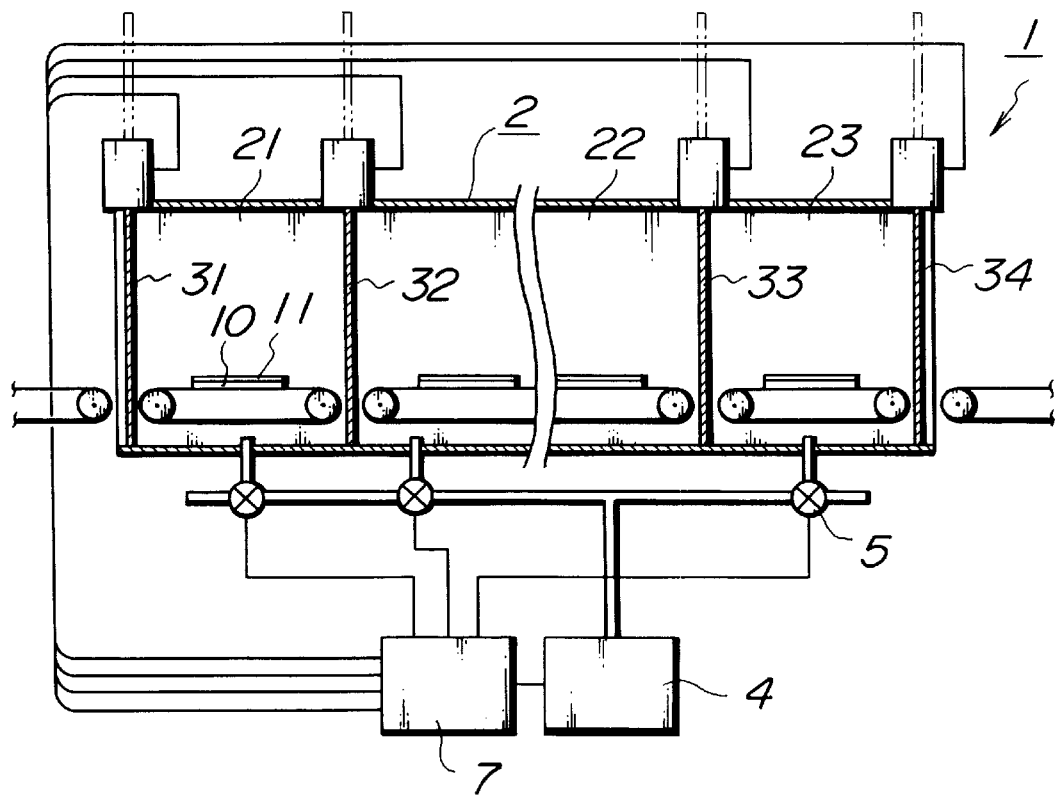
FIG. 2 is a schematic diagram showing a second embodiment of a substrate drying device according to the present invention.

FIG. 2 shows a second embodiment of the present invention. Although the substrate drying device 1 has been explained as performing a batch processing in the first embodiment described above, the present invention is not limited to the batch processing, and it can perform a continuous processing in a production line. This second embodiment shows a configuration in which the continuous processing is performed.

In this second embodiment, the reduced pressure enclosure 2 is composed of three chambers of a front chamber 21, main chamber 22, and rear chamber 23. Freely operable airproof doors are provided independently such that a first airproof door 31 is provided at an entrance side of the front chamber 21, a second airproof door 32 between the front chamber 21 and main chamber 22, a third airproof door 33 between the main chamber 22 and rear chamber 23, and a fourth airproof door 34 at an exit side of the rear chamber 23.

Additionally, each of the chambers 21, 22, and 23 are provided with electromagnetic valves 5 which can switch between the exhaustion device 4 side and atmosphere side. As described in an example of the front chamber 21, in such a state that the first airproof door 31 and second airproof door 32 are closed, the pressure of the front chamber 21 alone can be reduced and returned to the atmospheric pressure.

When the substrate 10 is dried using the substrate drying device 1 with the configuration described above, firstly, the first airproof door 31 is opened, and the front chamber 21 is maintained in such a state that the substrate 10 can be transported into the front chamber 21. Incidentally, at this time, the second airproof door 32 and fourth airproof door 34 are closed and inside of the main chamber 22 and rear chamber 23 are in reduced pressure state.

When the substrate 10 has been transported into the front chamber 21, the first airproof door 31 is closed and the inside pressure of the front chamber 21 is reduced to an extent similar to that of the main chamber 22. Then, the pressure difference between the front chamber 21 and main chamber 22 is removed, so that the second airproof door 32 is opened while the first airproof door 31 is closed, the substrate 10 is transported into the main chamber 22, and the second airproof door 32 is again closed.

In this manner, after the substrate 10 has been transported into the main chamber 22, the inside pressure of the front chamber 21 is caused to return to the atmospheric pressure, and if the first airproof door 31 is opened when the pressure reaches the atmospheric pressure, next substrate 10 can be received into the front chamber 21. At this time, as the second airproof door 32 is closed, even if the pressure of the front chamber 21 is returned to the atmospheric pressure, the main chamber 22 is not affected to keep the reduced pressure state.

When the substrate 10 which has been transported and in which eliminating air bubbles and drying have been performed, as is described above, enters the rear chamber 23, the third airproof door 33 is closed. Then the inside pressure of the rear chamber 23 is returned to the atmospheric pressure, and the fourth airproof door 34 is opened when the pressure has been returned to the atmospheric pressure. Therefore, the substrate 10 can be taken out from the substrate drying device 1 to outside, so that it is transported to a subsequent step, such as an exposure step.

Then, when taking out the substrate 10 is completed, the fourth airproof door 34 is closed, and after the inside pressure of the rear chamber 23 is reduced, the third airproof door 33 is opened. Since then, by repeating the procedure described above, it is possible to cause a plurality of substrates 10 to pass through the substrate drying device 1 continuously, that is, a sequential processing can be performed. Incidentally, at this time, operation of each electromagnetic valve 5 as well as opening and closing of each of the airproof doors 31 to 34 are controlled by the controller 7. Also, when the embodiment is carried into effect, the electric heater 8 can be placed in the main chamber 22 or in the rear chamber 23.

Figure 3:
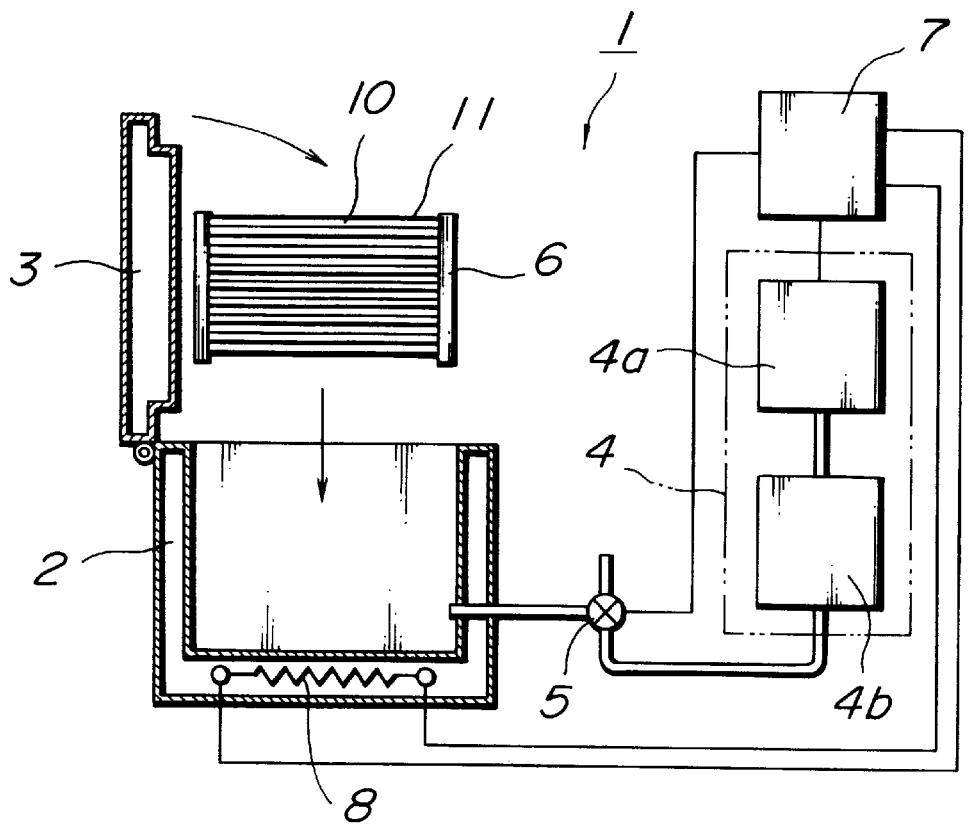
FIG. 3 is a schematic diagram showing a third embodiment of a substrate drying device according to the present invention.
Figure 4:
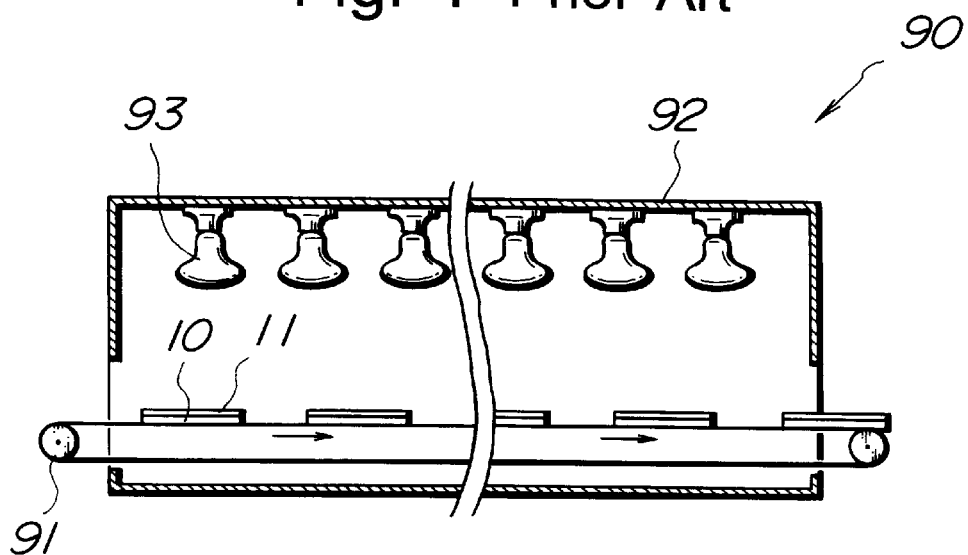
FIG. 4 is a schematic diagram showing an example of the prior art.

FIG. 3 shows a third embodiment of the present invention. In either of the first or second embodiment described above, the inside pressure of the reduced pressure enclosure 2 is reduced directly by means of the exhaustion device 4, such as a vacuum pump or blower. According to examination results of the present inventors, it was proved that there were a wide variety of application materials 11 applied to the substrate 10, and their drying speeds were different.

In particular, in the case where the application material 11 is diluted with a solvent with a high volatility, it was confirmed that, when the inside pressure in the reduced pressure enclosure 2 is reduced gradually by means of the exhaustion device 4 as with the foregoing embodiments, the evaporation of the solvent will exceed the operation of eliminating air bubbles, resulting in an insufficient function for eliminating air bubbles. Then, this third embodiment has been performed in order to achieve the condition on the desirable time to reach the degree of vacuum described above. In the present embodiment, the exhaustion device 4, along with the exhaustion pump 4a described above, is provided with a reserve tank 4b which has a volume capable of rapidly reducing a pressure of an internal volume of the reduced pressure enclosure 2, and the reserve tank 4b maintains a necessary predetermined negative pressure by means of the exhaustion pump 4a.

When the substrates 10 to which the application material 11 is applied are received into the reduced pressure enclosure 2 and the airproof door 3 is closed, then the electromagnetic valve 5 is actuated to connect the reserve tank 4b to the reduced pressure enclosure 2, causing the reduced pressure enclosure 2 to reach the predetermined degree of vacuum in a moment.

Therefore, the function for eliminating air bubbles and evaporation of the solvent are advanced concurrently, so that the insufficient function for eliminating air bubbles can be avoided, which may result in such a manner that the evaporation of the solvent precedes to advance the drying of the application material 11 in some compositions of the application material 11, as with the foregoing embodiments. Here, in this third embodiment, the part other than described above is similar to that in the foregoing first embodiment, so that the detailed explanation will be omitted any further.

Incidentally, for simplifying the explanation and readily understanding, the foregoing description has been performed in the context where the substrate 10 is, for example, a printed circuit board and the application material 11 is an etching resist material or solder resist material, however, the present invention is not so limited, for example, the substrate 10 may be a semiconductor substrate, as described above, further, may be a container type package such as a package for a pin grid array.

Also, the application material 11 is not limited to the foregoing resist material, for example, the drying device 1 of the present invention can be adopted as a forming means of such a member where the application material 11 itself acts a function, such as formation of a diaphragm for forming cells of a liquid crystal display device and plasma display device.

Furthermore, the substrate which is subjected to processing of eliminating air bubbles and drying according to the substrate drying device of the present invention has apparently different conditions of residual air bubbles as compared with that in the prior art. That is, the substrate has no defective as a production substrate. Specifically, when dried in the prior art, sometimes air bubbles of approximately 30 micrometers may remain, on the contrary, the substrate according to the present invention hardly has residual air bubbles of approximately 30 micrometers. In particular, when PSR-4000AU S-5 (manufactured by Taiyo Ink MFG.) as an application material is applied to a substrate with a film thickness of 100 micrometers, it was confirmed that even no air bubble of approximately 10 micrometers remained.

An applied film thickness of an application material is approximately 50 micrometers in a normal application method, however, in a case of, for example, 300 micrometers, by repeating a procedure of application, eliminating air bubbles, and drying of 100 micrometers for three times, the applied film thickness of 300 micrometers of the application material can be achieved. Therefore, the substrate prepared in this manner is within the scope of the present invention.

EXAMPLES

Next, the specific effects of the present invention will be described in connection with the embodiments, although the invention is not so limited.

Example 1

A polyimide material for BGA (300 mm×400 mm) was used as an applied material, and ink (PSR-4000AU S-5, manufactured by Taiyo Ink Seizo) was applied to a surface of the applied material to a thickness of 100±10 micrometers using a printing machine (Seria semi-automatic printing machine). Additionally, a viscosity of the ink used was adjusted to 220 Ps. The stencil used was a stainless 90 (mesh/inch)/Bias 3° strain, manufactured by Premax. After the application, the sample was dried by the substrate drying device according to the present invention. The drying condition was such that after the application but within 20 seconds, the sample was inserted into the substrate drying device, and after it was subjected to a degree of vacuum of 300 mmHg (39996 Pa) for 57 seconds, then it was inserted and held vertically in a slit type dry rack, and within 5 minutes, it was cured by a hot air circulating box type dryer (manufactured by Tabai Espec) at a temperature of 80±3° C. for 30 minutes. This sample is referred to as sample 1 according to the present invention.

Comparative Example 1

As a processing according to the conventional method, a material which was applied similar to Example 1 was inserted into the slit type dry rack without drying processing by the substrate drying device according to the present invention, and after it was left in a condition at 25±5° C. and 55±10%RH for 15 minutes, it was cured by the hot air circulating box type dryer similar to Example 1 at a temperature of 80±3° C. for 30 minutes. This sample is referred to as comparative sample 1.

Comparative Example 2

After a material was applied in the same manner as Example 1, it was inserted into the slit type dry rack without drying processing by the substrate drying device according to the present invention, and within 5 minutes, it was cured by the hot air circulating box type dryer (manufactured by Tabai Espec) at a temperature of 80±3° C. for 30 minutes. This sample is referred to as comparative sample 2.

Drying Performance

Respective inks which were applied and dried of sample 1 and comparative samples 1 and 2 described above were recovered with a scoop to measure a viscosity thereof by EHD type viscometer (manufactured by Tokyo Keiki, 1.5 degrees cone, number of revolution of 5.0 rpm). The assessment was denoted with a percentage of the ink for a viscosity after dried versus an initial viscosity. The results are shown in Table 1. Incidentally, an initial viscosity of the ink was 221 Ps and the numbers of samples were three.

Eliminating Air bubbles Performance

Each of sample 1 and comparative samples 1 and 2 was prepared to be test piece of 150×150 mm, and air bubbles having a diameter of more than 10 micrometers were visually counted with a magnification of 200 in lattices of 10×10 mm for three pieces. Sum of the counts (total lattice number was 225) was divided by the lattice number, and assessment was performed by average values per unit lattice. The results are shown in Table 2.

TABLE 1

|  | Viscosity | Coefficient of viscosity increase |
|---|---|---|
| Sample 1 | 323 Ps | 146.15% |
| Comparative example 1 | 232 Ps | 104.98% |
| Comparative example 2 | 223 Ps | 100.90% |

TABLE 2

| Sample 1 | Comparative sample 1 | Comparative sample 2 |
|---|---|---|
| 0.14 | 1.10 | 3.41 |

Unit: number/100 mm$^2$

The sample processed by the substrate drying device according to the present invention has a high coefficient of viscosity increase, that is, this means the drying time is short. Additionally, as the viscosity is increased, even if an applied material is placed vertically, it will be prevented that the ink applied may be dropped or an applied thickness may be changed. On the other hand, in the comparative samples, it will be understood that the viscosity of ink is hardly increased and the drying times are insufficient because the samples are not processed.

In addition, the sample processed by the substrate drying device according to the present invention has few residual air bubbles so that an applied film after cured is excellent without including any air bubbles. And, it is proved that, even if the film includes some air bubbles, either air bubble has a diameter less than 10 micrometers under visual inspection, affecting electric characteristics of a substrate little.

On the other hand, the comparative samples included air bubbles more than seven times, and also many residual air bubbles had a diameter approximately 30 micrometers. That is, in the method of the prior art, it is presumed that, when air bubbles emerge to an ink surface, the air bubbles larger than 30 micrometers would burst, but the air bubbles below would remain without burst. Also, an applied substrate including many air bubbles of such size may have defective in electric characteristics, and its quality can not be assured.

As set forth hereinabove, in a method of the prior art, a processing for eliminating air bubbles has been performed only by a buoyant force setting up against the viscosity of the application material, so that a long period of time is required until the processing is completed, resulting in residence of substrates in a drying step. However, in the present invention, the processing for eliminating air bubbles has been accelerated by placing the substrate in a reduced pressure atmosphere and the evaporation of a solvent is also promoted at the same time, thereby enabling the time of the drying step to shorten to significantly improve production efficiency.

Additionally, as the exhaustion device is composed of the exhaustion pump and reserve tank, it is not required to be large. The present invention can surely perform the processing for eliminating air bubbles for application materials with various characters including such application materials where it is difficult to obtain the function of eliminating air bubbles because a solvent is volatile and drying advances fast. The present invention is effective for various application materials, and also has an excellent effect on enhancing the performance of such drying devices.

While the presently preferred embodiments of the present invention have been shown and described, it will be understood that the present invention is not limited thereto, and that various changes and modifications may be made by those skilled in the art without departing from the scope of the invention as set forth in the appended claims.

What is claimed is:

1. A substrate drying device for eliminating air bubbles in a liquid application material applied to a surface of a substrate and drying the material, said substrate drying device comprising:

a reduced pressure enclosure having an inside and comprising an airproof door provided at least at one position thereof wherein the inside of the reduced pressure enclosure is made a sealed state when said airproof door is closed;

an exhaustion device for exhausting air inside of said reduced pressure enclosure, said exhaustion device comprising a reserve tank which has a volume capable of rapidly reducing a pressure of an internal volume of said reduced pressure enclosure to maintain a predetermined negative pressure; and a controller for controlling the driving of said exhaustion device by connecting said reserve tank to said reduced pressure enclosure, to attain a degree of vacuum in a range of from 260 to 360 mmHg (34663 to 47996 Pa) within a time to reach said degree of vacuum in a range of below 10 seconds and above 5 seconds, controlled by said controller, wherein said substrate is caused to be under a reduced pressure state to eliminate air bubbles in the application material and dry material after receiving said substrates into said reduced pressure enclosure and after closing said airproof door to make inside of said reduced pressure enclosure an airproof state by performing a rapid exhaustion of the inside of said reduced pressure enclosure by said exhaustion device.

2. A substrate drying device according to claim 1, wherein said controller operates said exhausting device such that after reaching said degree of vacuum in said enclosure, said degree of vacuum is held within a time in the range of 10 seconds or more to less than 180 seconds.

3. A method for eliminating air bubbles in a liquid application material applied to a surface of a substrate and for drying the material, the method comprises the steps of:

receiving said substrate to which said application material has been applied into inside of a reduced pressure enclosure;

causing inside of said reduced pressure enclosure to be in an airproof state; and exhausting rapidly by an exhaustion device which is communicated with said reduced pressure enclosure and exhausts inside of the enclosure, to a degree of vacuum in the range of from 260 to 360 mmHg (34663 to 47996 Pa) within a time to reach said degree of vacuum in a range of below 10 seconds and above 5 seconds, in order to eliminate the air bubbles in the application material and to dry the material.

4. A method for eliminating air bubbles in a liquid application material applied to a surface of a substrate and for drying the material according to claim 3, wherein after reaching said degree of vacuum, said degree of vacuum is held within a time in the range of 10 seconds or more to less than 180 seconds.

5. A substrate prepared by applying a liquid application material on the surface thereof, eliminating air bubbles in said application material, drying the material, and performing an additional step, wherein eliminating air bubbles and drying the material are performed by receiving the substrate to which said application material has been applied into a sealed container and by reducing a pressure inside of said sealed container to a degree of vacuum in a range of from 260 to 360 mmHg (34663 to 47996 Pa) within a time to reach said degree of vacuum in a range of below 10 seconds and above 5 seconds.

* * * * *